United States Patent
Roeters et al.

(10) Patent No.: US 6,856,010 B2
(45) Date of Patent: Feb. 15, 2005

(54) THIN SCALE OUTLINE PACKAGE

(75) Inventors: Glen E. Roeters, Huntington Beach, CA (US); John Patrick Sprint, Huntington Beach, CA (US); Joel Andrew Mearig, Huntington Beach, CA (US)

(73) Assignee: Staktek Group L.P., Austin, TX (US)

( * ) Notice: Subject to any disclaimer, the term of this patent is extended or adjusted under 35 U.S.C. 154(b) by 0 days.

(21) Appl. No.: 10/620,157

(22) Filed: Jul. 14, 2003

(65) Prior Publication Data

US 2004/0108584 A1 Jun. 10, 2004

Related U.S. Application Data

(63) Continuation-in-part of application No. 10/310,368, filed on Dec. 5, 2002, now abandoned.

(51) Int. Cl.⁷ .............................................. H01L 23/02
(52) U.S. Cl. ...................................... 257/686; 257/692
(58) Field of Search ............................... 257/685, 686, 257/692, 723

(56) References Cited

U.S. PATENT DOCUMENTS

| | | |
|---|---|---|
| 3,316,455 A | 4/1967 | Hucke, III |
| 3,340,439 A | 9/1967 | Huncshen et al. |
| 3,370,203 A | 2/1968 | Kravitz et al. |
| 3,437,882 A | 4/1969 | Cayzer |
| 3,529,213 A | 9/1970 | Ferrand et al. |
| 3,723,977 A | 3/1973 | Schaufele |
| 3,746,934 A | 7/1973 | Stein |
| 4,371,912 A | 2/1983 | Guzik |
| 4,502,098 A | 2/1985 | Brown et al. |
| 4,638,348 A | 1/1987 | Brown et al. |
| 4,761,681 A | 8/1988 | Reid |
| 4,823,233 A | 4/1989 | Brown et al. |
| 4,833,568 A | 5/1989 | Berhold |
| 4,841,355 A | 6/1989 | Parks |
| 4,851,695 A | 7/1989 | Stein |

(List continued on next page.)

FOREIGN PATENT DOCUMENTS

| | | |
|---|---|---|
| JP | 5688324 | 7/1981 |
| JP | 59194460 | 11/1984 |
| JP | 60194548 | 10/1985 |
| JP | 62016535 | 1/1987 |
| JP | 62293749 | 12/1987 |
| JP | 1179437 | 7/1989 |
| JP | 1289190 | 11/1989 |
| JP | 2144986 | 6/1990 |
| JP | 2239651 | 9/1990 |
| JP | 3255656 | 11/1991 |
| JP | 4209562 | 7/1992 |
| JP | 677644 | 3/1994 |
| JP | 6132413 | 5/1994 |

OTHER PUBLICATIONS

Kenneth Mason Publications, Ltd. England; "Organic Card Device Carrier"; May 1990; No. 313.

(List continued on next page.)

*Primary Examiner*—Roy Potter
(74) *Attorney, Agent, or Firm*—Andrews Kurth LLP

(57) ABSTRACT

The present invention provides a plurality of vertically stacked semiconductor dies which are electrically connected to each other. Each semiconductor die has leads which extend out from at least two opposed side surfaces of the semiconductor die. Each lead defines a first junction, a second junction, an inner width and an outer width. The second junctions of the leads of the upper semiconductor die are electrically connected to the first junctions of the leads of the lower semiconductor die. Additionally, the inner widths of the leads of the upper semiconductor die prior to electrically connecting the leads of the upper and lower semiconductor dies are less than the outer widths of the leads of the lower semiconductor die.

14 Claims, 7 Drawing Sheets

U.S. PATENT DOCUMENTS

| | | |
|---|---|---|
| 4,868,712 A | 9/1989 | Woodman |
| 4,953,060 A | 8/1990 | Lauffer et al. |
| 4,956,694 A | 9/1990 | Eide |
| 5,016,138 A | 5/1991 | Woodman |
| 5,051,865 A | 9/1991 | Kato |
| 5,117,282 A | 5/1992 | Salatino |
| 5,128,831 A | 7/1992 | Fox, III et al. |
| 5,198,888 A | 3/1993 | Sugano et al. |
| 5,201,451 A | 4/1993 | Desai et al. |
| 5,231,304 A | 7/1993 | Solomon |
| 5,239,447 A | 8/1993 | Cotues et al. |
| 5,269,453 A | 12/1993 | Melton et al. |
| 5,282,565 A | 2/1994 | Melton |
| 5,284,796 A | 2/1994 | Nakanishi et al. |
| 5,311,401 A | 5/1994 | Gates, Jr. et al. |
| 5,313,096 A | 5/1994 | Eide |
| 5,324,569 A | 6/1994 | Nagesh et al. |
| 5,328,087 A | 7/1994 | Nelson et al. |
| 5,343,075 A | 8/1994 | Nishino |
| 5,362,986 A | 11/1994 | Angiulli et al. |
| 5,373,189 A | 12/1994 | Massit et al. |
| 5,375,041 A | 12/1994 | McMahon |
| 5,376,825 A | 12/1994 | Tukamoto et al. |
| 5,384,689 A | 1/1995 | Shen |
| 5,397,916 A | 3/1995 | Normington |
| 5,432,678 A | 7/1995 | Russell et al. |
| 5,434,745 A | 7/1995 | Shokrgozar et al. |
| 5,448,511 A | 9/1995 | Paurus et al. |
| 5,466,634 A | 11/1995 | Beilstein, Jr. et al. |
| 5,471,368 A | 11/1995 | Downie et al. |
| 5,481,134 A | 1/1996 | Sobhani et al. |
| 5,514,907 A | 5/1996 | Moshayedi |
| 5,561,593 A | 10/1996 | Rotolante |
| 5,607,538 A | 3/1997 | Cooke |
| 5,612,570 A | 3/1997 | Eide et al. |
| 5,625,221 A | 4/1997 | Kim et al. |
| 5,637,536 A | 6/1997 | Val |
| 5,646,446 A | 7/1997 | Nicewarner, Jr. et al. |
| 5,677,569 A | 10/1997 | Choi et al. |
| 5,700,715 A | 12/1997 | Pasch |
| 5,712,767 A | 1/1998 | Koizumi |
| 5,726,492 A | 3/1998 | Suzuki et al. |
| 5,731,633 A | 3/1998 | Clayton |
| 5,759,046 A | 6/1998 | Ingraham et al. |
| 5,776,797 A | 7/1998 | Nicewarner, Jr. et al. |
| 5,818,106 A | 10/1998 | Kunimatsu |
| 5,834,843 A | 11/1998 | Mori et al. |
| 5,835,988 A * | 11/1998 | Ishii ............................ 257/684 |
| 5,857,858 A | 1/1999 | Gorowitz et al. |
| 5,869,353 A | 2/1999 | Levy et al. |
| 5,869,896 A | 2/1999 | Baker et al. |
| 5,926,369 A | 7/1999 | Ingraham et al. |
| 5,930,603 A | 7/1999 | Tsuji et al. |
| 5,950,304 A | 9/1999 | Khandros et al. |
| RE36,325 E | 10/1999 | Corbett et al. |
| 5,994,166 A | 11/1999 | Akram et al. |
| 6,014,316 A | 1/2000 | Eide |
| 6,057,381 A | 5/2000 | Ma et al. |
| 6,172,874 B1 | 1/2001 | Bartilson |
| 6,180,881 B1 | 1/2001 | Isaak |
| 6,188,127 B1 | 2/2001 | Senba et al. |
| 6,222,737 B1 | 4/2001 | Ross |
| 6,236,565 B1 | 5/2001 | Gordon |
| 6,262,895 B1 | 7/2001 | Forthun |
| 6,269,003 B1 | 7/2001 | Wen-Chen |
| 6,323,060 B1 | 11/2001 | Isaak |
| 6,351,029 B1 | 2/2002 | Isaak |
| 6,360,433 B1 | 3/2002 | Ross |
| 6,404,043 B1 | 6/2002 | Isaak |
| 6,426,240 B2 | 7/2002 | Isaak |
| 6,426,549 B1 | 7/2002 | Isaak |
| 6,437,433 B1 | 8/2002 | Ross |
| 6,462,408 B1 * | 10/2002 | Wehrly, Jr. .................. 257/686 |
| 6,472,735 B2 | 10/2002 | Isaak |
| 6,473,308 B2 | 10/2002 | Forthun |
| 6,514,793 B2 | 2/2003 | Isaak |
| 6,544,815 B2 | 4/2003 | Isaak |
| 6,566,746 B2 | 5/2003 | Isaak et al. |
| 6,573,460 B2 | 6/2003 | Roeters et al. |
| 6,573,461 B2 | 6/2003 | Roeters et al. |
| 6,753,599 B2 * | 6/2004 | Kim ............................ 257/686 |

OTHER PUBLICATIONS

Quadrant Technology, Inc.; "Megabyte per Cubic Inch"; May 1988.

"Three Dimensional Packaging," Defense Science, May 1988, p. 65.

Robert Amunroe, "Ball Grid Array Technology," EDN Products Edition, Jan 1997, pp. 23–24.

"Stacked Surface Mount Package With Interposing Heat Sink", Jun. 1990, p. 276, IBM Technical Disclosure Bulletin.

* cited by examiner

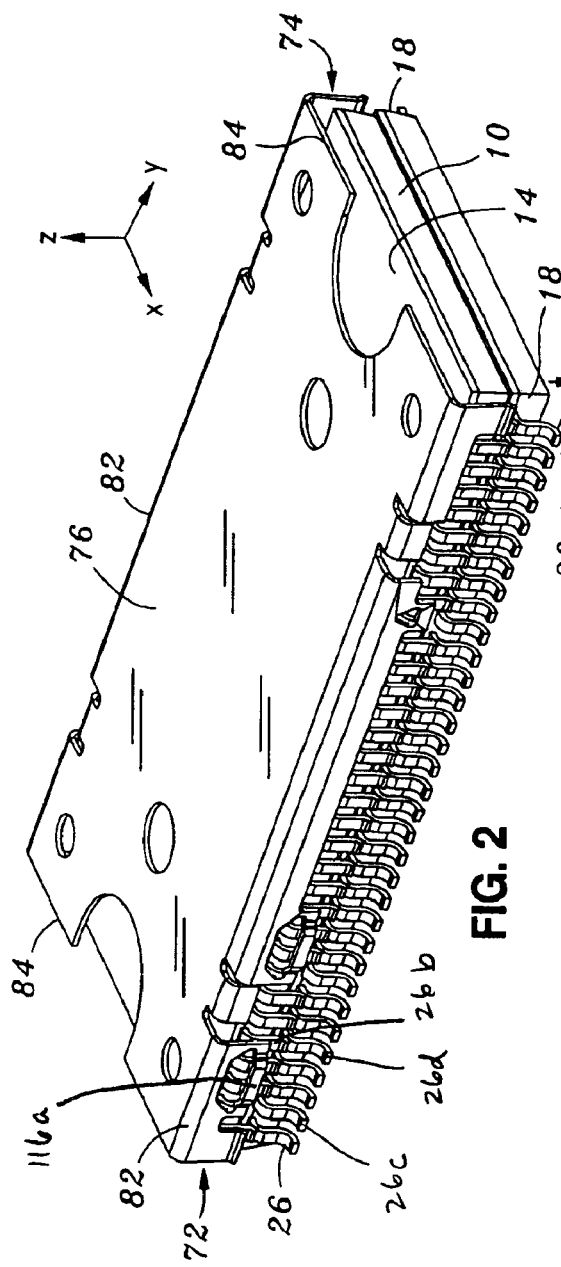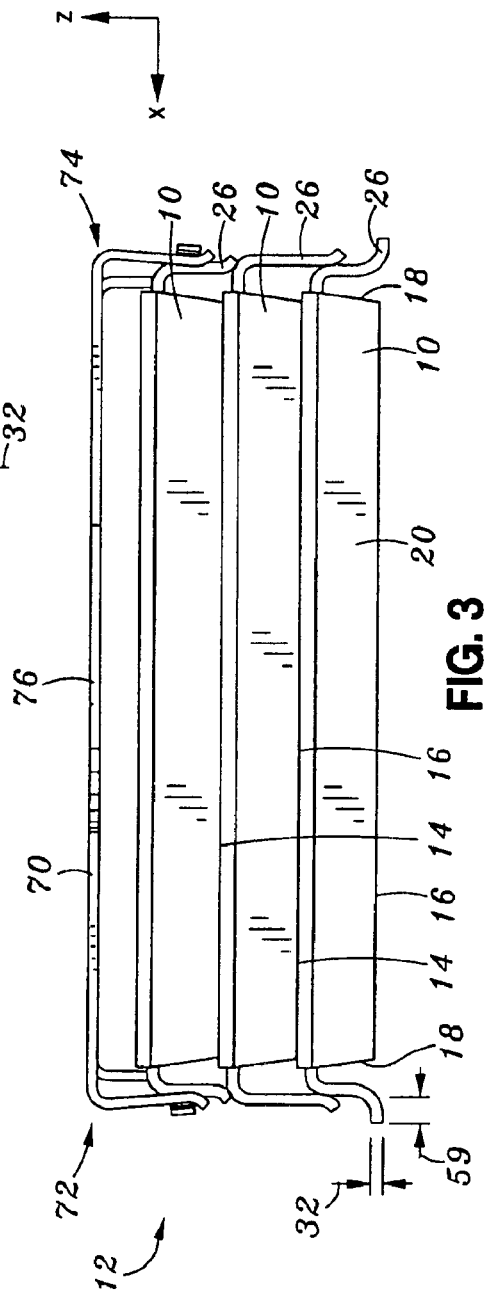

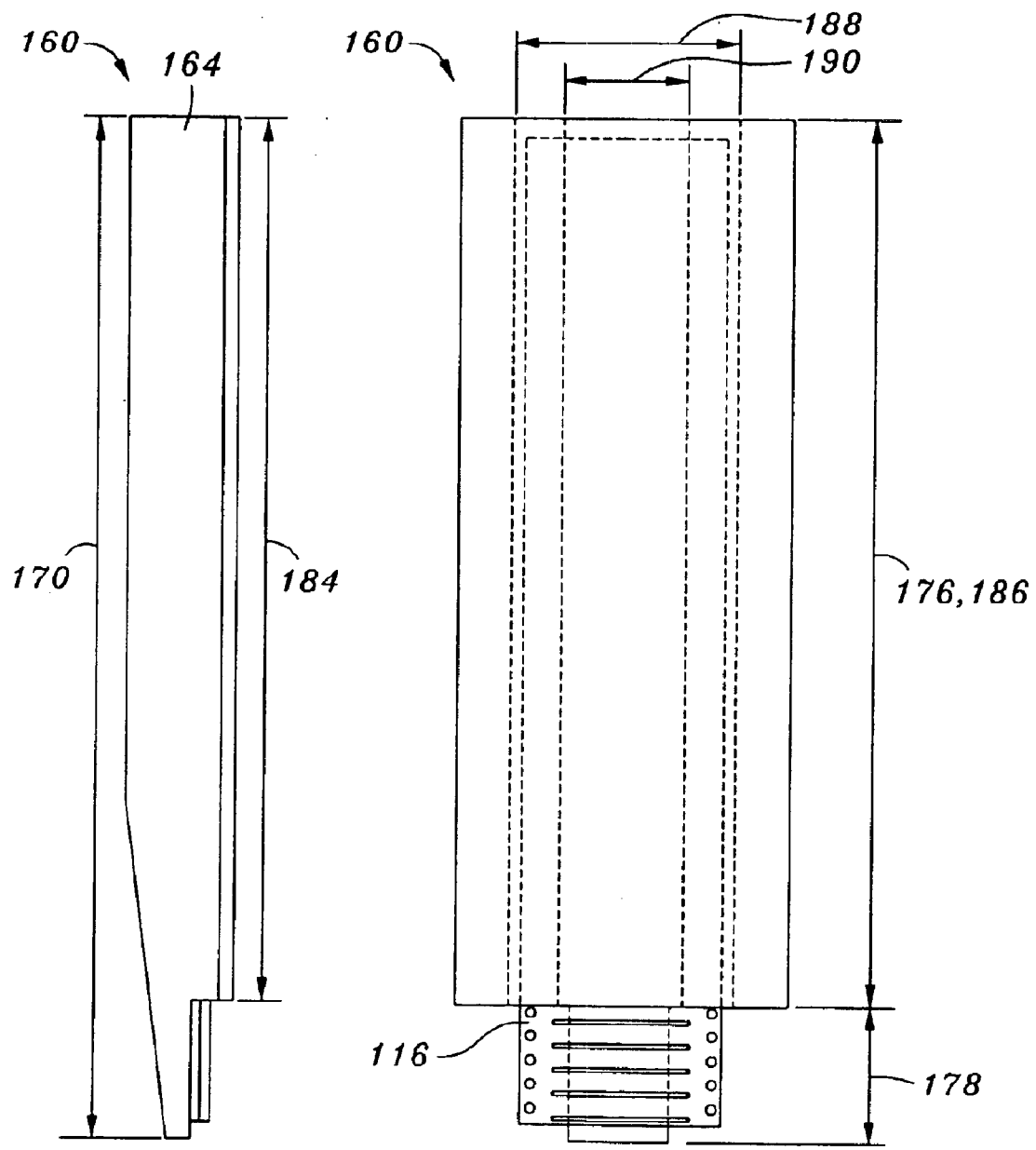

THIN SCALE OUTLINE PACKAGE

CROSS-REFERENCE TO RELATED APPLICATIONS

This is a continuation-in-part of application Ser. No. 10/310,368, filed Dec. 5, 2002 now abandoned.

STATEMENT RE: FEDERALLY SPONSORED RESEARCH/DEVELOPMENT

Not Applicable

BACKGROUND OF THE INVENTION

The present invention relates generally to vertically stacking and electrically connecting respective leads of upper and lower semiconductor dies. Additionally, the present invention relates to electrically connecting at least two leads of the same semiconductor dies.

In the field of electronics, a plurality of semiconductor dies are electrically connected to a printed circuit board. As time has progressed in the field of electronics, there has been an ever increasing need to increase the number of semiconductor dies that may be electrically connected to a printed circuit board yet maintaining or reducing the size of the printed circuit board to which the semiconductor dies are attached. Increasing the number of semiconductor dies on a printed circuit board is driven by the demands of consumers wanting smaller yet more powerful electronic devices. To this end, multiple techniques have been employed to vertically stack and electrically connect semiconductor dies to reduce the footprint required to electrically connect the semiconductor dies to a printed circuit board. The present invention provides another technique of vertically stacking and electrically connecting at least two semiconductor dies.

BRIEF SUMMARY OF THE INVENTION

In an embodiment of the present invention, a semiconductor die stack is provided which includes at least two semiconductor dies vertically stacked upon one another. Each semiconductor die defines opposed top and bottom surfaces and opposed pairs of longitudinal and lateral side surfaces. Additionally, leads extend out from at least one of the side surfaces of each of the semiconductor dies. The leads define first end portions, middle portions, second end portions, first junctions and second junctions. The second junctions of the leads of the upper semiconductor die are electrically connected to respective ones of the first junctions of the leads of the lower semiconductor die. The first and second junctions of the leads of the upper and lower semiconductor dies are bent in opposing directions.

In relation to the connection between respective leads of the upper and lower semiconductor dies, the middle portions of the leads of the upper semiconductor die may be electrically connected to respective ones of the first junctions of the leads of the lower semiconductor die. Bend radii, bend distances and bend angles of the first junctions of the leads of the upper and lower semiconductor dies may be equal to each other. The second junctions of the leads of the upper semiconductor die may have a flared ski tip configuration.

Alternatively, in relation to the connection between respective leads of the upper and lower semiconductor dies, the first junctions of the leads of the upper semiconductor die may be electrically connected to respective ones of the middle portions of the leads of the lower semiconductor die. Bend distances of the first junctions of the leads of the upper semiconductor die may be greater than the bend distances of the first junctions of the leads of the lower semiconductor die. The difference between the bend distances of the first junctions of the leads of the upper and lower semiconductor dies may be at least a width of the leads of the lower semiconductor die. The second junctions of the leads of the upper semiconductor die may have a flared ski tip configuration.

In another alternative in relation to the connection between respective leads of the upper and lower semiconductor dies, the middle portions of the leads of the upper semiconductor die are electrically connected to respective ones of the middle portions of the leads of the lower semiconductor die.

The leads of the same semiconductor die may be electrically connected to each other to create a chip select function which allows each die within the die stack to be independently addressed. For example, a lead of the upper semiconductor die is trimmed such that the lead does not physically contact the lead of the lower semiconductor die. The upper semiconductor die is activated (i.e., turned on) when an electrical signal is present in the lead. The lead of the lower semiconductor die is not trimmed. An electrical signal is sent through the leads of an adjacent lead which is electrically communicated to the lead of the upper semiconductor die thereby activating the upper semiconductor die. In this regard, the upper semiconductor die may be independently addressed.

The following discussion will discuss the electrical connection between leads of the same semiconductor die. The semiconductor die stack may further comprise at least one narrow jumper strip electrically connected to adjacent leads of at least one of the semiconductor dies. The narrow jumper strip may be electrically connected to the middle portions of the adjacent leads. The narrow jumper strip may have a cross sectional area along its length equal to or greater than a cross sectional area along the height of the leads to which the narrow jumper strips are attached. The narrow jumper strip may be fabricated from the same material as the leads of the semiconductor die.

The semiconductor die stack may further comprise at least one wide jumper strip electrically connected to at least two leads of at least one of the semiconductor dies. At least one interposed lead may be disposed between two of the leads that are electrically connected to each other. The wide jumper strip may have a C shaped configuration. The wide jumper strip may be electrically connected to the middle portions of the leads. The wide jumper strip may have a cross sectional area along its length at least a cross sectional area along a height of the leads to which the wide jumper strip is attached. The wide jumper strip may be fabricated from the same material as the leads of the semiconductor die.

In another embodiment of the present invention, a method of vertically stacking a plurality of semiconductor dies is provided which includes the following steps. Step a) of providing a semiconductor die with leads extending from side surfaces of the semiconductor die. Step b) of electrically connecting at least two leads of the semiconductor die. Step c) of stacking another semiconductor die on top of the semiconductor die so as to electrically connect leads of the upper semiconductor die to respective ones of the leads of the lower semiconductor die. Step d) of electrically connecting at least two leads of the top semiconductor die. And, Step e) of repeating steps c) and d) at least once.

Steps b) and d) of the above described method of electrically connecting at least two leads of the semiconductor die may be accomplished with narrow jumper strips. Additionally, steps b) and d) of the above described method of electrically connecting at least two leads of the semiconductor die may be accomplished with wide jumper strips. Furthermore, steps b) and d) of the above described method of electrically connecting at least two leads of the semiconductor die are accomplished with jumper plates. Lastly, steps b) and d) of the above described method of electrically connecting at least two leads of the semiconductor die are accomplished with a guide(s).

The method of vertically stacking and electrically connecting respective leads of the upper and lower semiconductor dies may further comprise step f) of maintaining a clamping force on the stacked semiconductor dies.

Step c) may further comprise the steps of step i) of aligning second junctions of the leads of the upper semiconductor die with respective ones of the first junctions of the leads of the lower semiconductor die and step ii) of applying a clamping force on the stacked semiconductor dies.

BRIEF DESCRIPTION OF THE DRAWINGS

These, as well as other features of the present invention, will become more apparent upon reference to the drawings wherein:

FIG. 2 is a perspective view of two vertically stacked semiconductor dies with a jumper plate placed on top of the stacked semiconductor dies;

FIG. 3 is a side view of three vertically stacked semiconductor dies with a jumper plate placed on top of the stacked semiconductor dies;

FIGS. 8A, 8B and 8C are a side view, front view and top view of the guide and a plurality of wide jumper strips, respectively.

DETAILED DESCRIPTION OF THE INVENTION

Figure 1:
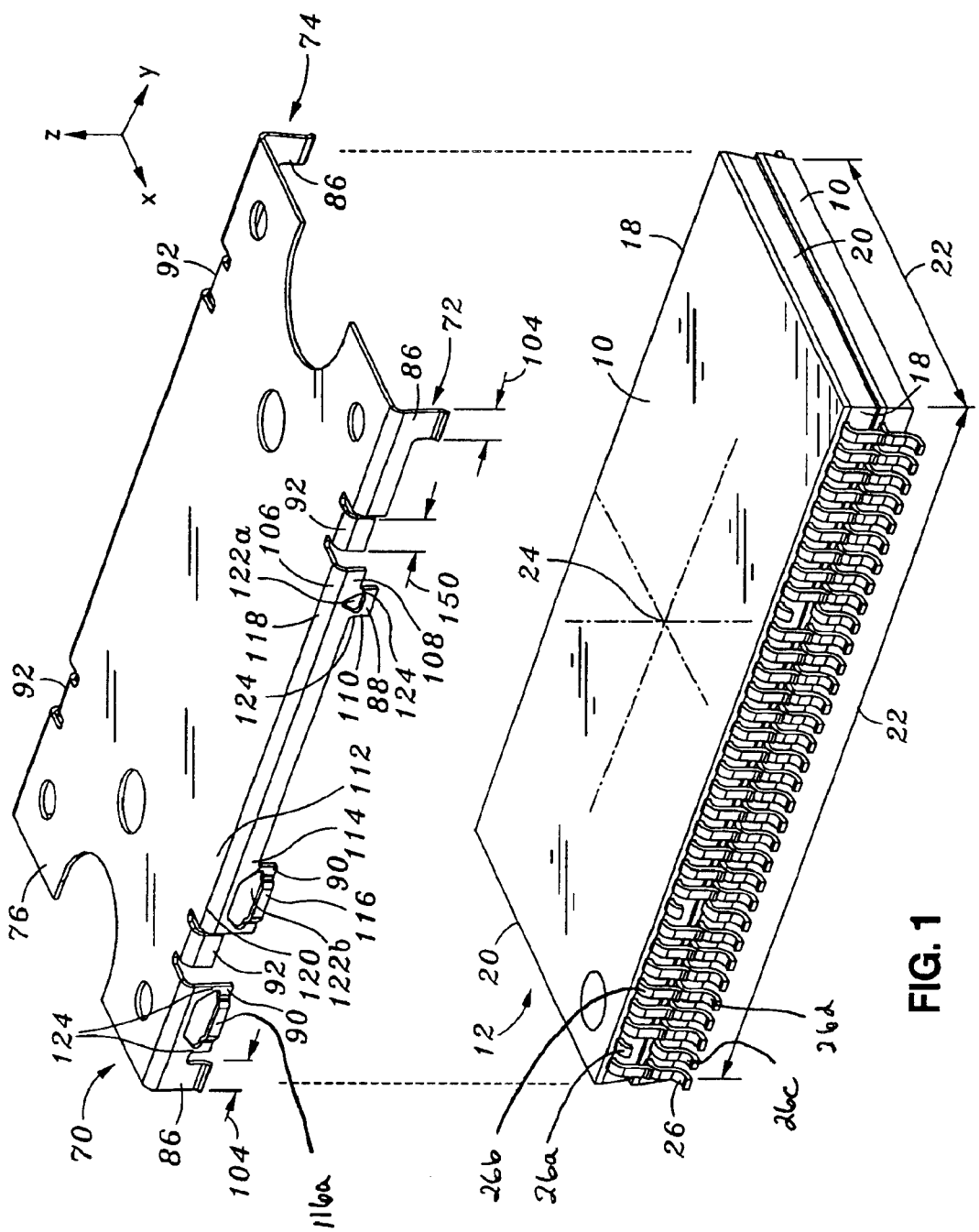
FIG. 1 is a perspective view of two vertically stacked semiconductor dies with a jumper plate to be placed on top of the stacked semiconductor dies.

In this description, the various features of the present invention will be described in relation to generic semiconductor dies 10. By way of example and not limitation, the semiconductor die 10 may be a thinned and background bare die, a chip scale package (CSP) device, and/or a thin scale outline package (TSOP). In this regard, the application of the features of the present invention is not limited by the type of semiconductor die 10 or die package within the scope and spirit of the present invention.

Referring now to the drawings, the same are used to illustrate the preferred embodiments of the present invention and not for limiting the present invention. The drawings are oriented with a X-Y-Z coordinate system. The Z axis will be referred to as the vertical axis. The positive and negative Z-direction being referred to as the upward and downward side of the vertical axis, respectively. The X-Y plane will be referred to as the horizontal plane. The positive and negative X direction will be referred to as the front and back side, respectively. The positive and negative Y direction will be referred to as the right and left side, respectively.

FIG. 1 depicts two vertically stacked and electrically connected semiconductor dies 10; whereas, FIG. 3 depicts three vertically stacked and electrically connected semiconductor dies 10. In this regard, the present invention is not limited by the number of semiconductor dies 10 to be vertically stacked and electrically connected to each other. In other words, the present invention may be applied to a semiconductor die stack 12 having two or more semiconductor dies 10.

In FIG. 3, three semiconductor dies 10 are vertically stacked upon and electrically connected to each other. Each semiconductor die 10 defines opposed top and bottom surfaces 14, 16, a pair of opposed longitudinal side surfaces 18 (see FIGS. 1 and 3) and a pair of opposed lateral side surfaces 20 (see FIG. 1). The top and bottom surfaces 14, 16 of the semiconductor die 10 define a semiconductor die footprint 22, as shown in FIG. 1. The die footprint 22 is the area enclosed by the pair of longitudinal and lateral side surfaces 18, 20. Each semiconductor die 10 has a die circuit (not shown).

The top and bottom surfaces 14, 16 of the semiconductor dies 10 that are vertically stacked upon each other are centrally aligned with each other. In particular, the top and bottom surfaces 14, 16 of the semiconductor dies 10 generally have a rectangular configuration. The surface area center 24 of the top surfaces 14 of the semiconductor dies 10 are vertically aligned with each other. Preferably, the top surfaces 14 of the upper semiconductor die(s) 10 are the same size as the top surfaces 14 of the lower semiconductor die(s) 10.

Leads 26 are physically attached to each semiconductor die 10. More particularly, the leads 26 are electrically connected to the die circuit of the semiconductor die 10. In FIGS. 1–4 and 7, the leads 26 are attached to the pair of longitudinal side surfaces 18 and are connected to the die circuit through the pair of longitudinal side surfaces 18. In other words, the leads 26 extend out from both longitudinal side surfaces 18 of each semiconductor die 10.

The leads 26 of each semiconductor die 10 may extend out from various side surfaces 18, 20 of the semiconductor dies 10. The leads 26 may extend out from the pair of the lateral side surfaces 20 of each semiconductor die 10. Preferably, the leads 26 extend out from the pair of longitudinal side surfaces 18 of each semiconductor die 10.

Additionally, the leads 26 extend out from the same side surfaces 18, 20 as the other semiconductor dies 10 within the semiconductor die stack 12. For example, as shown in FIGS. 1 and 3, the leads 26 of the lowest semiconductor die 10 extend out from both longitudinal side surfaces 18, and the leads 26 of each upper semiconductor die(s) 10 extend out from both longitudinal side surfaces 18.

Figure 4:
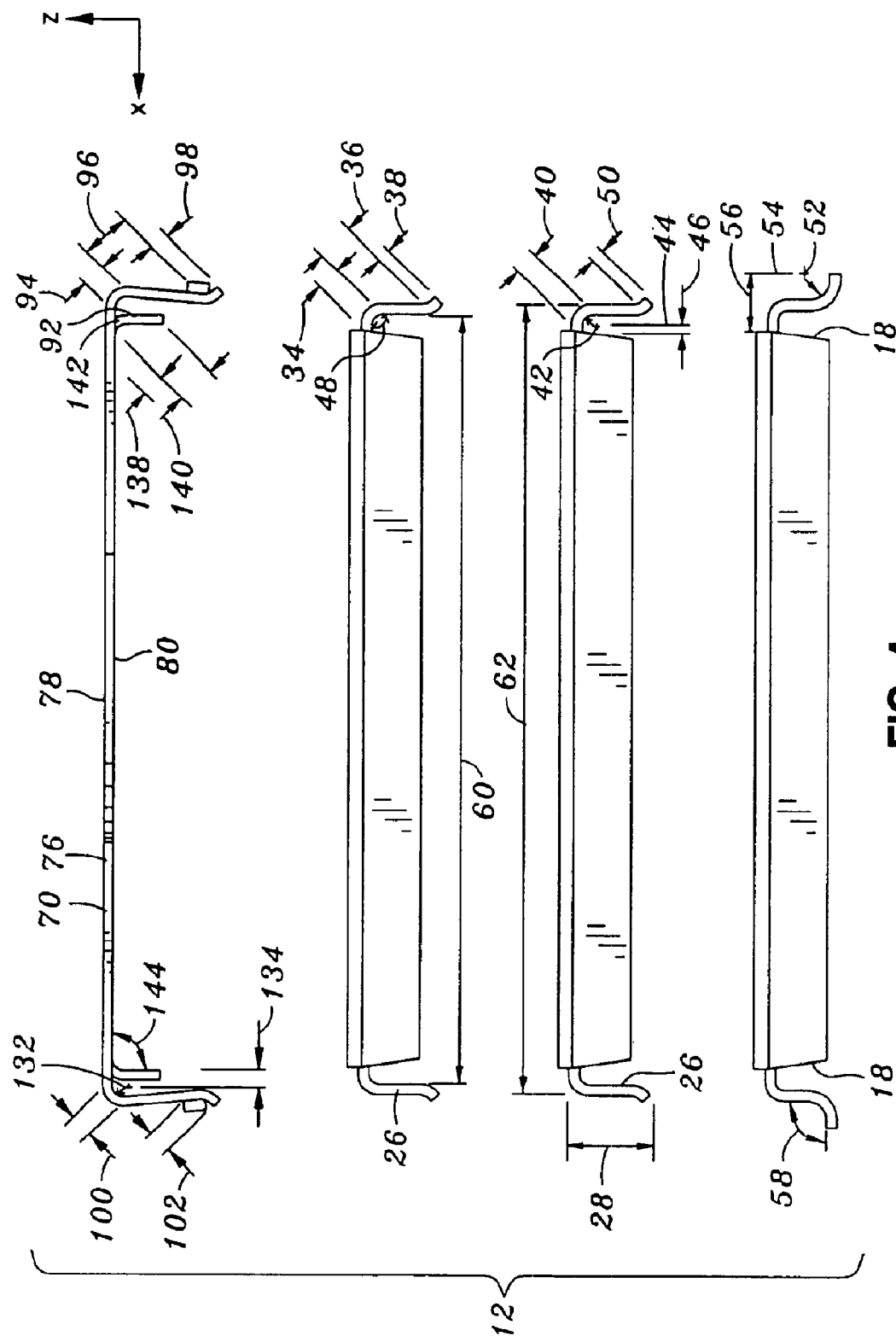
FIG. 4 is an exploded view of three vertically stacked semiconductor dies with a jumper plate.

Each lead 26 has a rectangular cross section along a height 28 of the lead 26, as shown in FIG. 4. Each lead defines a length 30 and width 32, as shown in FIG. 2. Referring now to FIG. 4, each lead 26 defines a first end portion 34, a middle portion 36 and a second end portion 38. A first junction 40 is defined at the intersection of the first end portion 34 and the middle portion 36 of each lead 26. The first junction 40 defines a first junction bend radius 42. The distance from the center 42 of the first junction bend radius 42 to the side surface 18 from which the lead extends out from define a first junction bend distance 46. The first end portion 34 and the middle portion 36 define a first junction bend angle 48. A second junction 50 is defined at the intersection of the middle portion 36 and the second end portion 38. The second junction 50 defines a second junction bend radius 52. The distance from the center 54 of the second junction bend radius 52 to the side surface 18 from which the lead 26 extends out from define a second junction bend distance 56. The middle portion 36 and the second end portion 38 define a second junction bend angle 58. The second end portions 38 of the leads 26 defines a bottom surface 59 (see FIG. 3).

As shown in FIG. 4, the leads 26 collectively of each semiconductor die 10 define an inner width 60 and an outer width 62. The inner width 60 is the distances from the inner surfaces of the leads 26 extending out from one of the side surfaces 18 of the upper semiconductor die 10 to the inner surfaces of the leads 26 extending out from the opposed side surface 18 of the same semiconductor die 10. The outer width 60 is the distances from the outer surfaces of the leads 26 extending out from one of the side surfaces 18 of the lower semiconductor die 10 to the outer surfaces of the leads 26 of the same semiconductor die 10.

The leads 26 are fabricated from conductive material such as copper. The leads 26 are fabricated from material that is malleable but yet resilient. In particular, the leads 26 are capable of being formed. However, once formed into its original shape, the leads 26 elastically deform when a force is applied to the leads 26 and return to its original shape when the force is removed from the leads 26.

In FIGS. 3 and 4, the first end portions 34 of the leads 26 extend out substantially perpendicular to the longitudinal side surfaces 18 and substantially parallel to the opposed top and bottom surfaces 14, 16 of the semiconductor die 10. The leads 26 extend out substantially perpendicular to the longitudinal side surfaces 18 and substantially parallel to the opposed top and bottom surfaces 14, 16 of the semiconductor die 10 as long as the first junctions 34 of the leads 26 are outside the footprint 22 of the semiconductor die 10.

The first junctions 40 of the leads 26 of the semiconductor die 10 are bent so as to direct the middle portions 36 of the leads 26 downward. In relation to the leads 26 of the upper semiconductor die(s) 10, the first junctions 40 are bent so as to direct the middle portions 36 of the leads 26 toward respective ones of the leads 26 of the lower semiconductor die 10. The first junction bend angles 48 of the leads 26 are constant within each of the semiconductor dies 10. The first junction bend angles 48 of the leads 26 between the upper and lower semiconductor dies 10 may be the same. Alternatively, the first junction bend angles 48 of the leads 26 between the upper and lower semiconductor dies 10 may be different. For example, the first junction bend angle 48 of the leads 26 of the lowest semiconductor die 10 may be 90 degrees; whereas, the first junction bend angles 48 of the leads 26 of the upper semiconductor die(s) 10 may be less than 90 degrees. Preferably, the first junction bend angles 48 of the leads 26 of the upper and lower semiconductor dies 10 are approximately 90 degrees.

The first junction bend distances 46 of the leads 26 within each semiconductor die 10 may be the same; whereas, the first junction bend distances 46 of the leads 26 of each subsequent upper semiconductor die 10 may be different. For example, the first junction bend distances 46 of the leads 26 of each subsequent upper semiconductor die 10 are greater than the first junction bend distances 46 of the leads 26 of its respective lower semiconductor die 10 by the width 32 of the leads of the lower semiconductor die 10. Alternatively and preferably, the first junction bend distances 46 of the leads 26 of all the semiconductor dies 10 within the semiconductor die stack 12 are the same.

The first junction bend radius 42 of the leads within each semiconductor die 10 may be the same; whereas, the first junction bend radius 42 of the leads 26 of each subsequent upper semiconductor die 10 may be different. Alternatively, the first junction bend radius 42 of the leads 26 of all the semiconductor dies 10 within the semiconductor die stack 12 may be the same.

Generally, the second junctions 50 of the leads 26 of the semiconductor die 10 are bent so as to direct the second end portions 38 of the leads 26 away from the semiconductor die 10. The second junction bend is counter to the first junction bend. In other words, if the second junction 50 is bent in a clockwise direction, then the first junction 40 is bent in a counter-clockwise direction. In relation to the lowest semiconductor die 10, in FIG. 4, the second end portions 38 of the leads 26 of the lowest semiconductor die 10 are substantially parallel to the top and bottom surfaces 14, 16 of the semiconductor die 10. The second end portions 38 of the leads 26 of the lowest semiconductor die 10 are below the bottom surface 16 of the lowest semiconductor die 10. The second end portions 38 of the leads 26 of the lowest semiconductor die 10 are substantially parallel to the top and bottom surfaces 14, 16 of the semiconductor die 10 as long as the second end portions 38 may be electrically connected to the overall electric circuit. Preferably, the bottom surfaces 59 of the second end portions 38 reside in a common horizontal plane.

In relation to the upper semiconductor die(s) 10, the second junctions 50 of the leads 26 are bent such that the second end portions 38 of the leads 26 of the upper semiconductor dies 10 are bent away from the semiconductor die 10. The second end portions 38 of the leads 26 of the upper semiconductor die 10 may be shorter than the second end portions 38 of the leads 26 of the lowest semiconductor die 10. The second end portions 38 of the leads 26 of the upper semiconductor die 10 are below the bottom surface 16 of the same semiconductor die 10. Preferably, the bend angles 58 of the second junctions 50 of the leads 26 of the upper semiconductor die 10 are approximately 135 degrees. The second junctions 50 and the second end portions 38 of the leads 26 of the upper semiconductor die 10 form a ski tip configuration.

The bend radii 42, bend angles 48 and bend distances 46 of the first junctions 40 of the leads 26 of the upper semiconductor die 10 are set such that the second junctions 50 of the same leads 26 are positioned over the first junctions 40 of the leads 26 of the lower semiconductor die 10. Additionally, the inner widths 60 of the leads 26 of the upper semiconductor die 10 are set to be less than the outer widths 62 of the leads 26 of the lower semiconductor die 10. Initially, the second junctions 50 of the leads 26 of the upper semiconductor die 10 will merely touch the first junctions 40 of the leads 26 of the lower semiconductor die 10. Subsequently, the upper semiconductor die 10 will be pressed onto the lower semiconductor die 10. Since the first junctions 40 and the second junctions 50 are bent opposite to each other, the second junctions 50 of the leads 26 of the upper semiconductor die 10 will expand such that the inner width 60 of the leads 26 of the upper semiconductor die 10 equals the outer width 62 of the leads 26 of the lower semiconductor die 10. In other words, the leads 26 of the upper semiconductor die 10 will slide over the outside of the leads 26 of the lower semiconductor die 10. The leads 26 of the upper semiconductor die 10 creates pressure on the leads 26 of the lower semiconductor die 10. The leads 26 of the upper semiconductor die 10 are press fit onto the leads 26 of the lower semiconductor die 10. The press fit ensures that every lead 26 of the upper semiconductor die 10 is in physical contact (excluding the trimmed leads) to respective one of the leads 26 of the lower semiconductor die 10. The leads 26 of the upper semiconductor die 10 are preferably centrally aligned along its length 30 with respective ones of the leads 26 of the lower semiconductor die 10.

The leads 26 of the upper semiconductor die 10 may be set such that leads 26 of the upper semiconductor die 10 engages the leads 26 of the lower semiconductor die 10. In other words, once the upper semiconductor die 10 is vertically stacked and pressed onto the lower semiconductor die 10, the upper and lower semiconductor dies 10 will separate only if there is an external force applied to the stacked semiconductor dies 10. Vibrational forces outside of the stacked semiconductor dies 10 are an example of the external force.

As discussed above, the leads 26 of the upper semiconductor die 10 is press fit onto the leads 26 of the lower semiconductor die 10. Due to the press fit, the leads 26 of the lower semiconductor die 10 may produce a force directed upward onto the leads 26 of the upper semiconductor die 10 thereby tending to push the upper semiconductor die 10 off the lower semiconductor die 10. To counteract these upward forces, the middle portions 36 of the leads 26 of the upper semiconductor die 10 may be lengthened such that the middle portions 38 of the leads 26 of the upper semiconductor die 10 contacts respective first junctions 40 of the leads 26 of the lower semiconductor die 10. In this regard, the contact between the leads 26 of the upper and lower semiconductor dies 10 produces frictional forces applied to the leads 26 of the upper semiconductor die 10 which have a vertical component equal in magnitude but opposite in direction to the upward force of the leads 26 of the lower semiconductor die 10. Hence, the upper and lower semiconductor dies 10 are in static relationship.

Alternatively, the first junction bend distances 46 of the leads 26 of the upper semiconductor die 10 may be set to be greater than the first junction bend distances 46 of the leads 26 of the lower semiconductor die 10. This allows the first junction bend angles 48 and the length of the middle portions 36 of the leads of the upper semiconductor die 10 to be set such that the second junctions 50 of the leads 26 of the upper semiconductor die 10 contact the middle portions 36 of the leads 26 of the lower semiconductor die 10. This contact is illustrated by the leads of the bottom two stacked semiconductor dies of FIG. 3. In this configuration, when the upper semiconductor die 10 is vertically stacked upon and pressed onto the lower semiconductor die 10, the leads 26 of the upper semiconductor die 10 produce a clamping force. In particular, the leads 26 that extend from one of the side surfaces 18 of the upper semiconductor die 10 produces a force which is equal in magnitude but opposite in direction to a force produced by the leads 26 that extend from the opposed side surface 18 of the upper semiconductor die 10.

The lengths of the middle portions 36 of the leads 26 of the upper semiconductor die 10 may be set such that the leads 26 of the upper semiconductor die 10 will press against but not engage the leads 26 of the lower semiconductor die 10. In particular, the lengths of the middle portions 36 of the leads 26 of the upper semiconductor die 10 are set such that the second junctions 50 of the leads 26 of the upper semiconductor die 10 contacts but does not engage the first junctions 40 of the leads 26 of the lower semiconductor die 10 when the upper semiconductor die 10 is vertically stacked and pressed upon the lower semiconductor die 10. This is illustrated by the leads 26 of the top two semiconductor dies 10 of FIG. 3. An additional pressure is applied to the lower and upper semiconductor dies 10 to hold them together while respective leads 26 of the upper and lower semiconductor dies 10 are permanently attached to each other.

The leads 26 of the upper semiconductor die 10 are permanently attached to the leads 26 of the lower semiconductor die 10. The leads 26 of the upper and lower semiconductor dies 10 may be welded together. Alternatively, curable conductive material may be placed over respective leads 26 of the upper and lower semiconductor die 10, then cured. The use of solder dip is another methodology for creating the electrical connection of the TSOP leads. The use of weld and curable conductive material are examples and not limitations of the various method to attach respective leads 26 of the upper and lower semiconductor dies 10 within the spirit and scope of the present invention.

The semiconductor die stack 12 may further comprise a jumper plate 70, as shown in FIGS. 1 and 2. The jumper plate 70 electrically connects at least two leads 26 of the same semiconductor die 10. Preferably, the jumper plate 70 is fabricated from the same material as the leads 26 of the top semiconductor die 10.

The jumper plate 70 has an inverted U configuration when viewed from its side view (i.e., Y-axis). The side view of the jumper plate 70 is illustrated in FIGS. 3 and 4. The jumper plate 70 defines a first leg portion 72 opposed to a second leg portion 74 and a body portion 76. The body portion 76 defines opposed top and bottom surfaces 78, 80 (see FIG. 4). The body portion 76 defines a pair of opposed longitudinal edges 82 and a pair of opposed lateral edges 84 (see FIG. 2). The longitudinal edges 82 and lateral edges 84 collectively form a square configuration. Generally, the body portion 76 may expand over a greater surface area compared to the surface area of the top surface 14 of the top semiconductor die 10. The first and second leg portions 72, 74 may be attached to the pair of longitudinal edges 82. Optionally, a third and fourth leg portions (not shown) may be attached to the lateral edges 84. The first leg portion 72 is on the front side of the body portion 76, and the second leg portion 74 is on the back side of the body portion 76. The first and second leg portions 72, 74 may comprise a variety of types of legs such as holding legs 86, narrow jumper legs 88, wide jumper legs 90 and vertical regulator legs 92. Each type of leg 86, 88, 90, 92 will be discussed in turn.

At least two holding legs 86 extend from the body portion 76 of the jumper plate 70. More particularly, at least one holding legs 86 is attached to each of the longitudinal edges 82 of the body portion 76. For example, as shown in FIG. 1, two holding legs 86 are attached to each longitudinal edge 82 of the body portion 76 of the jumper plate 70, and the holding legs 86 are located at the distal ends of the longitudinal edges 82. The holding leg 86 has a first end portion 94, middle portion 96 and a second end portion 98, as shown in FIG. 4. The holding leg 86 defines first and second junctions 100, 102. The holding leg defines a length 104, as shown in FIG. 1. The holding legs 86 have similar physical and functional characteristics compared to the leads 26 of the upper semiconductor die 10. A discussion of the differences shall be discussed. The first end portions 94 of the holding legs 86 extend horizontally from the body portion 76; whereas, the first end portions 34 of the leads 26 of the upper semiconductor die 10 extend out from the semiconductor die 10. The holding legs 86 are configured such that the holding legs 86 engage leads 26 of the top semiconductor die 10; whereas, the leads 26 of the upper semiconductor die 10 may be configured to engage or merely press against the leads 26 of the lower semiconductor die 10. The holding legs 86 has a length 104 which may span one or more adjacent leads 26 of the semiconductor die 10.

Preferably, the holding legs 86 are attached to the body portion 76 of the jumper plate 70 directly opposite from each other. More preferably, the holding legs 70 are attached to the body portion 76 at the four corners of the body portion 76 on the longitudinal edges 82. In this regard, the holding legs 86 attached to the longitudinal edges 82 produce a clamping force so as to retain the jumper plate 70 onto the top semiconductor die 10. In other words, the jumper plate 70 is held in static relationship with the upper semiconductor die 10 because of the forces exerted by the holding legs 86.

At least one narrow jumper leg 88 or at least one wide jumper leg 90 is attached to the body portion 76 of the jumper plate 70. Referring to FIG. 1, the narrow jumper leg 88 defines a first end portion 106, middle portion 108 and a narrow jumper strip portion 110, and the wide jumper leg 90 defines a first end portion 112, middle portion 114 and a wide jumper strip portion 116.

The first end portions 106, 112 of the narrow and wide jumper legs 88, 90 extend horizontally from the body portion 76 of the jumper plate 70. The middle portions 108, 114 of the narrow and wide jumper legs 88, 90 are physically attached to the first end portions 106, 112 of the narrow and wide jumper legs 88, 90, respectively. The intersections at the first end portions 106, 112 and the middle portions 108, 114 of the narrow and wide jumper legs 88, 90 define first junctions 118, 120 of the narrow and wide jumper legs 88, 90, respectively. The first junctions 118, 120 have the same characteristics as the first junctions 100 of the holding legs 86.

The middle portions 108, 114 of the narrow and wide jumper legs 88, 90 are directed downward and are adjacent the top semiconductor die 10. The middle portions 108 of the narrow jumper legs may have an aperture 122a, and the middle portions 114 of the wide jumper legs 90 may have an aperture 122b. By way of example, the aperture may have a circular, rectangular, triangular or trapezoidal shape. Preferably, the aperture 122a formed on the narrow jumper leg 88 has a triangular shape with an apex of the triangular shape aperture 122a directed in the upward direction, and the aperture 122b formed on the wide jumper leg 90 has a trapezoid shape. Preferably, the aperture 122b formed on the wide jumper leg 90 has a trapezoidal shape with the base of the trapezoid directed toward the bottom of the wide jumper leg 90. The aperture 122a, 122b is formed by two posts 124, the jumper strip portion 110, 116 and the remainder of the middle portion 108, 114.

Figure 6A:
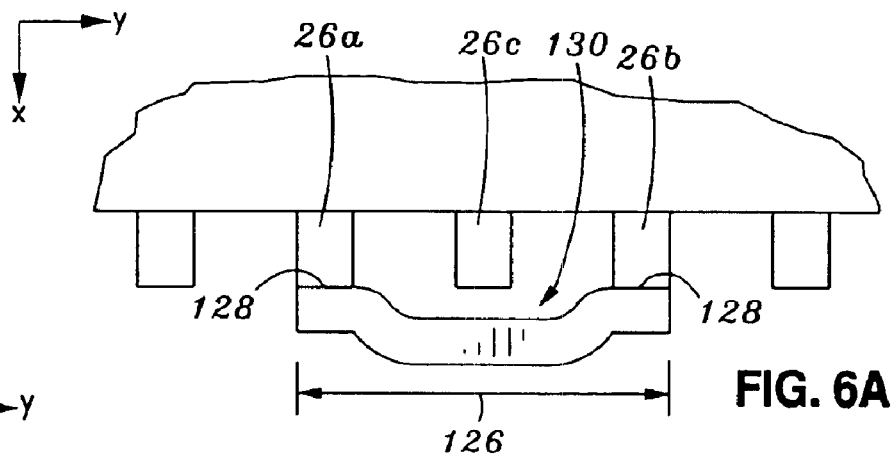
FIG. 6A is a top view of a wide jumper strip.
Figure 6B:
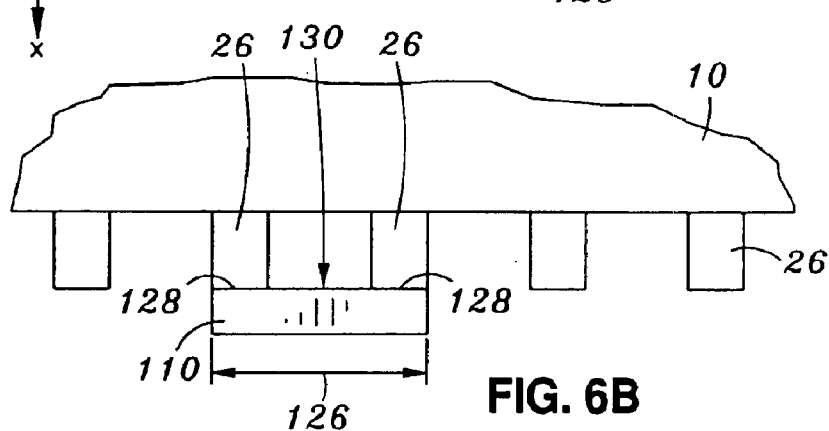
FIG. 6B is a top view of a narrow jumper strip.

The middle portion 108 of the narrow jumper leg 88 is attached to the narrow jumper strip portion 110, and the middle portion 114 of the wide jumper leg 90 is attached to the wide jumper strip portion 116. Referring now to FIGS. 6A and 6B, the same illustrates the top view of the semiconductor die stack 12 with the body portion 76 of the jumper plate 70 removed from the wide and narrow jumper strip portion 116, 110. Each of the narrow and wide jumper strip portions 110, 116 defines a length 126, two contact surfaces 128 and an inner side 130. The inner sides 130 of the narrow and wide jumper strip portions 110, 116 are the sides closest to the semiconductor die 10 when the jumper plate 70 is placed on the top semiconductor die 10.

The two contact surfaces 128 of the narrow and wide jumper strip portions 110, 116 are preferably flat. Additionally, the contact surfaces 128 cover the length 30 of the leads 26 of the top semiconductor die 10. The two contact surfaces 128 are located at the distal ends of the narrow and wide jumper strip portions 110, 116. The contact surfaces 128 are located on the inner side 130 of the narrow and wide jumper strip portions 110, 116. The two contact surfaces 128 are located in the same plane.

The narrow and wide jumper legs 88, 90 define a bend radius 132, bend distance 134 and bend angle 136, as shown in FIG. 4. The bend distance 134 is measured from the center of the bend radius 132 to the side surface 18, 20 of the semiconductor die 10. The bend angle 136 is defined by the angle at which the first end portion 106, 112 and the middle portion 108, 114 of the narrow and wide jumper legs 88, 90 are set.

The length 126 of the narrow jumper strip portion 110 is equal to the distance of two adjacent leads 26 of the top semiconductor die 10. The bend radius 132, bend distance 134 and bend angle 136 of the narrow jumper leg 88 is set such the two contact surfaces 128 of the narrow jumper strip portion 110 are aligned with respective adjacent leads 26 of the top semiconductor die 10 and flush with middle portions 36 of respective adjacent leads 26 of the top semiconductor die 10. For example, the bend distance 134 of the narrow jumper leg 88 may be greater than the bend distance 46 of the first junction 40 of the lead 26 of the top semiconductor die 10 by the width 32 of the lead 26 of the top semiconductor die 10. The contact surfaces 128 of the narrow jumper strip portion 110 are attached to respective adjacent leads 26 of the top semiconductor die 10. By way of example and not limitation, the narrow jumper strip portion 110 may be attached to the leads 26 through welding or a conductive material.

The wide jumper strip portion 116 has a C configuration, as shown in FIG. 6A. The length 126 of the wide jumper strip portion 116 is equal to at least two adjacent leads 26 of the top semiconductor die 10. The wide jumper strip portion 116 electrically connects leads 26a, 26b interposed with at least one lead 26c. As shown in FIG. 6A, lead 26a and lead 26b are interposed with lead 26c. Leads 26a and lead 26b are electrically connected to each other through the wide jumper strip portion 116 but lead 26c is not electrically connected to leads 26a or 26b. The C configuration of the wide jumper strip portion 116 avoids contact between the interposed lead 26c and the wide jumper strip portion 116. Preferably, but optionally, dispensable dielectric may be placed between the wide jumper strip portion 116 and the interposed lead(s) 26c to further ensure that the wide jumper strip portion 116 does not electrically connect to the interposed lead 26c.

The bend radius 132, bend distance 134 and bend angle 136 of the wide jumper leg 90 are configured such that the two contact surfaces 128 of the wide jumper strip portion 116 are aligned with respective leads 26 of the top semiconductor die 10 and flush with the middle portions 36 of respective leads 26 of the top semiconductor die 10. For example, the bend distance 134 of the wide jumper leg 90 may be greater than the bend distance 46 of the first junction 40 of the lead 26 of the top semiconductor die 10 by the width 32 of the lead 26 of the top semiconductor die 10. The contact surfaces 128 of the wide jumper strip portion 116 are attached to respective leads 26 of the top semiconductor die 10. By way of example and not limitation, the wide jumper strip portion 116 may be attached to the leads 26 through welding or a conductive material.

Figure 5B:
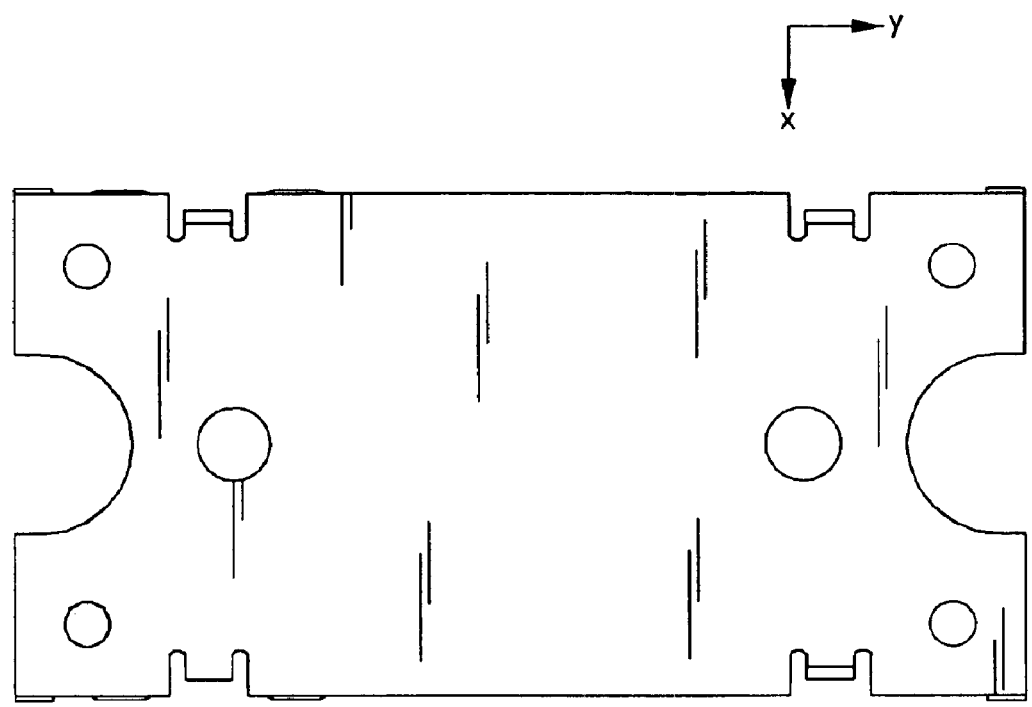
FIG. 5B is a top view of the jumper plate of FIG. 5A.
Figure 5A:
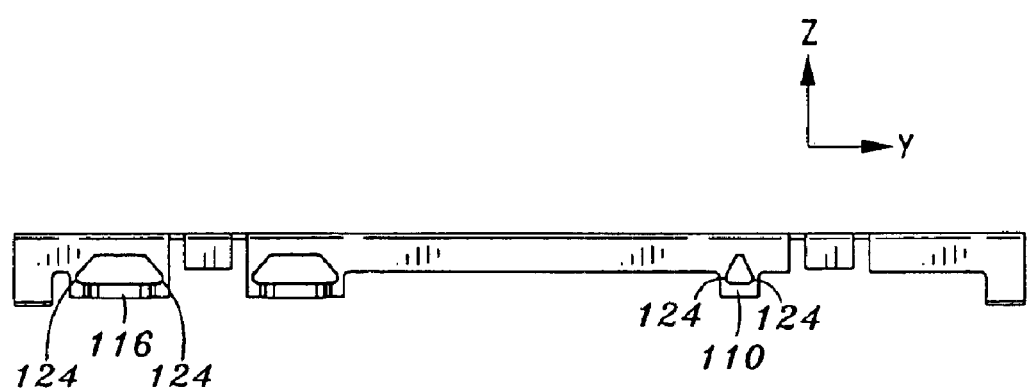
FIG. 5A is a front view of a jumper plate.

The narrow and wide jumper strip portions 110, 116 may be removed from the narrow and wide jumper legs 88, 90, respectively, by cutting the two posts 124, as shown in FIG. 5A. Typically, the narrow and wide jumper strip portions 110, 116 are removed from the narrow and wide jumper legs 88, 90, respectively, after the narrow and wide jumper strip portions 110, 116 have been attached to the leads 26 of the top semiconductor die 10.

The cross sectional area along the length 126 of the narrow and wide jumper strip portions 110, 116 are preferably the same as the cross sectional area along the height 28 of the leads 26 to which the narrow and wide jumper strip portions 110, 116 are attached. In this regard, the narrow and wide jumper strip portions 110, 116 do not impede the electrical signal that may proceed through the narrow and wide jumper strip portions 110, 116.

Additionally, at least one vertical regulator leg 92 is attached to one of the edges 82, 84 of the body portion 76 of the jumper plate 70, and at least two vertical regulator legs 92 are attached to the other opposed edge 82, 84 of the body portion 76 of the jumper plate 70. As shown in FIG. 4, the vertical regulator leg 92 defines a first end portion 138 and a second end portion 140. The intersection of the first and second end portions 138, 140 define a junction 142. The junction 142 has a bend angle 144. The bend angle 144 is defined by the first and second end portions 138, 140. The junction 142 has a bend radius 146. The distance from the center of the bend radius 146 to the respective side surface 18, 20 of the top semiconductor die 10 defines a bend distance 148. The first end portion 138 is attached to the body portion 76. The first end portion 138 extends from the body portion 76 in the horizontal plane.

The junction 142 is bent such that the second end portion 140 is directed downward toward the leads 26 of the top semiconductor die 10 and adjacent the side surfaces 18, 20 of the top semiconductor die 10. The bend distance 148 of the junction 142 of the vertical regulator leg 92 is set such that the distal edges of the second end portions 140 of the vertical regulator leg 92 touches the first end portions 34 of the leads 26 of the top semiconductor die 10 when the jumper plate 70 is placed over the top semiconductor die 10. The distal edges of the second end portions 140 of all the vertical regulator legs 92 are located in the same horizontal plane which is additionally parallel to the top surface 78 of the body portion 76 of the jumper plate 70. Additionally, the plane in which the distal edges of the second end portions 140 of all the vertical regulator legs 92 are located is parallel to the narrow and wide jumper strip portions 110, 116. The minimum width 150 of the vertical regulator leg 92 is the width 30 of one lead 26 of the top semiconductor die 10. Preferably, the width 150 of the vertical regulator leg 92 spans at least two adjacent leads 26 of the top semiconductor die 10. The vertical regulator leg 92 fixes the distance between the top semiconductor die 10 and the jumper plate 70.

The jumper plate 70 may electrically connect leads 26 of the same semiconductor die 10 within the die stack 12. The jumper plate 70 may be placed on top of the lowest semiconductor die 10 before the upper semiconductor dies 10 are vertically stacked thereon. The jumper plate 70 will attach appropriate narrow or wide jumper strip portions 110, 116 onto the leads 26 of the lowest semiconductor die 10. The jumper plate 70 except for the narrow and/or wide jumper strips portions 110, 116 are removed from the semiconductor die stack 12 before any additional devices can be stacked. Thereafter, an upper semiconductor die 10 is placed on the top of the lowest semiconductor die 10. A jumper plate 70 may be placed on the upper semiconductor die 10 to electrically connect the leads 26 of the upper semiconductor die 10. The process may be repeated for all of the semiconductor dies 10 within the die stack 12.

The leads 26 of the same semiconductor die 10 are electrically connected to each other to create a chip select function wherein each die 10 within the semiconductor die stack 12 may be independently addressed (i.e., turned on or off). In particular, FIG. 1 illustrates an upper semiconductor die 10 wherein the jumper plate 70 has not been attached thereto. Leads 26*a* and 26*b* of the upper semiconductor die 10 will be electrically connected to each other through the wide jumper strip portion 116*a*. Lead 26*a* has been trimmed such that the same 26*a* does not physically contact lead 26*c* which is immediately below lead 26*a*. In contrast, lead 26*b* does physically contact lead 26*d* which is immediately below lead 26*b*. Lead 26*a* activates the upper semiconductor die 10 when an electrical signal is present. FIG. 2 illustrates the jumper plate 70 attached to the upper semiconductor die 12 wherein the wide jumper strip portion 116*a* electrically connects leads 26*a* and 26*b*. The jumper strip portion 116*a* is severed from the jumper plate 70 at posts 124*a* and 124*b*. In this regard, a chip select function is created in that the upper semiconductor die 10 may be addressed or independently turned on by sending an electrical signal through lead 26*d* which travels through lead 26*b* to wide jumper strip portion 116*a* to present an electrical signal to lead 26*a* thereby activating the upper semiconductor die.

Figure 7:
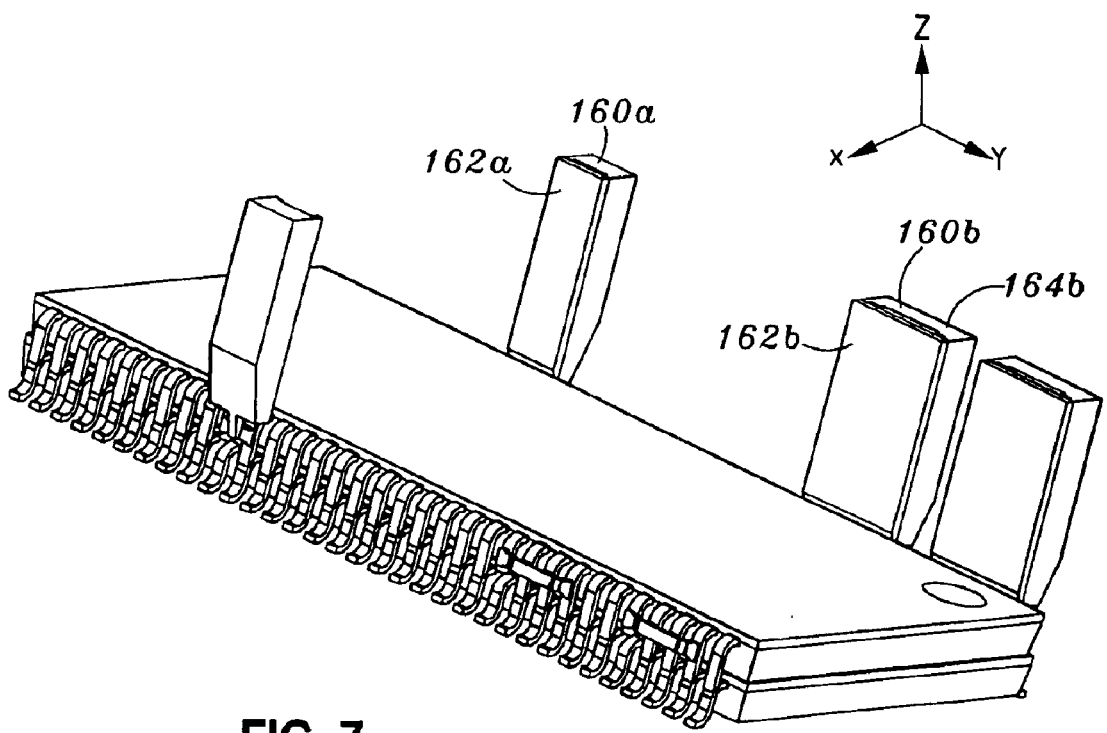
FIG. 7 is a perspective view of two semiconductor dies and four guides.

Alternatively, referring now to FIG. 7, a guide 160 filled with a plurality of narrow or wide jumper strip portions 110, 116 may place the narrow or wide jumper strip portions 110, 116 in fixed relationship with respective leads 26 of the top semiconductor die 10. The guide 160 includes a cover 162 and a magazine 164 referring now to FIGS. 8A–8C, the magazine 164 defines a length 166, width 168, height 170, an inside surface 172 and an outside surface 174. The guide 160 has a gripping portion 176 and a push portion 178.

The outside surface 174 of the magazine 164 is three flat surfaces. Two of the flat surfaces 174*a*,174*c* are parallel to each other and perpendicular to the remaining surface 174*b*. The inside surface 172 has a first configuration for the narrow jumper strip portion 110 and a second configuration for the wide jumper strip portion 116.

The cover 162 defines a length 180, width 182 and height 184. The cover 162 is flat rectangular plate. The cover 162 is sized to substantially match the overall area of the inside surface 172 of the magazine 164. In this regard, the length 180 and height 184 of the cover will match the length 166 of the magazine and the height 186 of the gripping portion 176. The gripping portion 176 of the guide 160 is defined when the cover 162 and the magazine 164 are attached to each other. The gripping portion 176 may be configured to receive an arm from an automatic pick and place machinery.

The distal end of the magazine 164 opposed to the gripping portion 176 defines the push portion 178. The push portion 178 is center in relation to the inside surface 172 of the magazine 164 along the length 166 of the inside surface 172. In this regard, when the narrow or wide jumper strip portions 110, 116 are inserted therein, the push portion 178 will provide support on the center of the narrow or wide jumper strip portions 110, 116.

A discussion of the first configuration of the inside surface 172 of the magazine 164 will be followed by a discussion of the second configuration of the inside surface 164 of the magazine.

The inside surface 172 of the first configuration has a channel shape (not shown). The channel defines a length and width. The length of the channel is approximately the length 126 of the narrow jumper strip portion 110. The width of the channel is approximately the width of the narrow jumper strip portion 110. The channel extends through the whole height 170 of the magazine 164. The length and width of the channel are sized such that the narrow jumper strip portions 110 has a friction fit when inserted therein.

In relation to the wide jumper strip, as shown in FIGS. 8A–8C, the inside surface 172 of the magazine forms a two step channel. The two side steps support the C configuration of the wide jumper strip portion 116. The wide channel 188 supports the two distal ends of the wide jumper strip portion 116, and the narrow channel 190 supports the middle of the wide jumper strip portion 116.

Figure 9B:
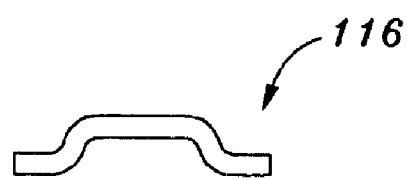
FIGS. 9A and 9B are a front view and top view of the plurality of wide jumper strips.
Figure 9A:
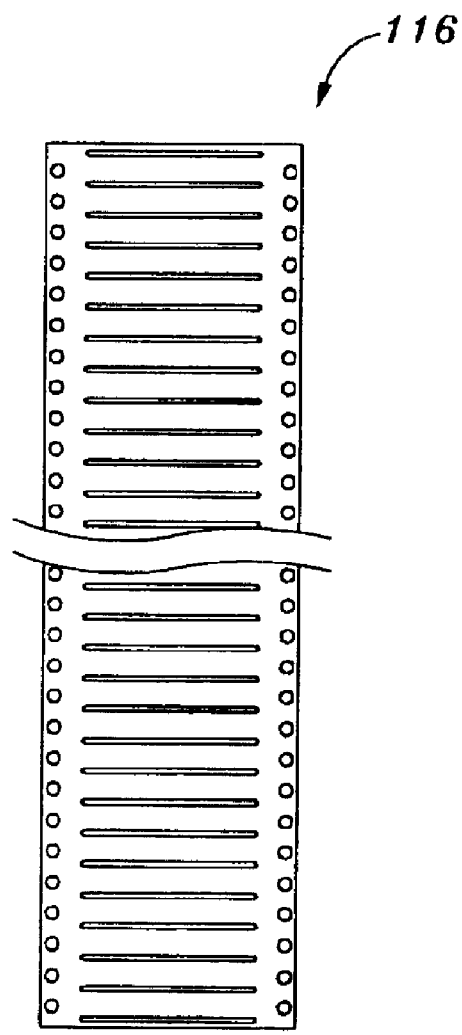

A plurality of narrow or wide jumper strip portions 110, 116 which are vertically stacked upon each other are inserted into the guide 160. FIGS. 9A and 9B illustrates a plurality of wide jumper strip portions 116. A first distal end of the plurality of narrow or wide jumper strip portions 110, 116 extend past the gripping portion 176 to the push portion 178. FIG. 8B illustrates the wide jumper strip portions 116 extending past the gripping portion 176 to the push portion 178. The push portion 178 contacts the middle of the narrow or wide jumper strip portions 110, 116. The fixed arm grips the guide 160 at the gripping portion 176 and positions the narrow or wide jumper strip portion 110, 116 adjacent the leads 26 to be electrically connected. The narrow or wide jumper strips portions 110, 116 are welded to respective leads 26, then the welded narrow or wide jumper strip portion 110, 116 is broken or removed from the plurality of narrow or wide jumper strip portions 110, 116 remaining in the guide 160.

Additional modifications and improvements of the present invention may also be apparent to those of ordinary skill in the art. Thus, the particular combination of parts and steps described and illustrated herein are intended to represent only one embodiment of the present invention, and are not intended to serve as limitations of alternative devices and methods within the spirit and scope of the invention.

What is claimed:

1. A semiconductor die stack comprising:
    at least two semiconductor dies vertically stacked upon each other, each semiconductor die defines opposed top and bottom surfaces and opposed pairs of longitudinal and lateral side surfaces;
    leads which extend out from at least one of the side surfaces of each of the semiconductor dies, the leads define first end portions, middle portions, second end portions, first junctions and second junctions, the second junctions of the leads of the upper semiconductor die are electrically connected to respective ones of the first junctions of the leads of the lower semiconductor die, the first and second junctions of the leads of the upper and lower semiconductor dies are bent in opposing directions;
    the middle portions of the leads of the upper semiconductor die being electrically connected to respective ones of the first junctions of the leads of the lower semiconductor die;
    the first junctions of the leads of the upper and lower semiconductor dies having a bend radii, bend distances, and bend angles, the bend radii, bend distances and bend angles of the first junctions of the leads of the upper and lower semiconductor dies being equal to each other; and
    the second junctions of the leads of the upper semiconductor die have a flared ski tip configuration.

2. A semiconductor die stack comprising:
    at least two semiconductor dies vertically stacked upon each other, each semiconductor die defines opposed top and bottom surfaces and opposed pairs of longitudinal and lateral side surfaces;
    leads which extend out from at least one of the side surfaces of each of the semiconductor dies, the leads define first end portions, middle portions, second end portions, first junctions and second junctions, the second junctions of the leads of the upper semiconductor die are electrically connected to respective ones of the first junctions of the leads of the lower semiconductor die, the first and second junctions of the leads of the upper and lower semiconductor dies are bent in opposing directions,
    the first junctions of the leads of the upper semiconductor die being electrically connected to respective ones of the middle portions of the leads of the lower semiconductor die;
    bend distances of the first junctions of the leads of the upper semiconductor die being greater than the bend distances of the first junctions of the leads of the lower semiconductor die.

3. The semiconductor die stack of claim 2 wherein the difference between the bend distances of the first junctions of the leads of the upper and lower semiconductor dies is at least a width of the leads of the lower semiconductor die.

4. The semiconductor die stack of claim 3 wherein the second junctions of the leads of the upper semiconductor die have a flared ski tip configuration.

5. A semiconductor die stack comprising:
    at least two semiconductor dies vertically stacked upon each other, each semiconductor die defines opposed top and bottom surfaces and opposed pairs of longitudinal and lateral side surfaces;
    leads which extend out from at least one of the side surfaces of each of the semiconductor dies, the leads define first end portions, middle portions, second end portions, first junctions and second junctions, the second junctions of the leads of the upper semiconductor die are electrically connected to respective ones of the first junctions of the leads of the lower semiconductor die, the first and second junctions of the leads of the upper and lower semiconductor dies are bent in opposing directions; and
    at least one narrow jumper strip electrically connected to adjacent leads of at least one of the semiconductor dies.

6. The semiconductor die stack of claim 5 wherein the narrow jumper strip(s) is electrically connected to the middle portions of the adjacent leads.

7. The semiconductor die stack of claim 6 wherein the narrow jumper strip has a cross sectional area along its length equal to a cross sectional area along the height of the leads to which the narrow jumper strips are attached.

8. The semiconductor die stack of claim 7 wherein the narrow jumper strip(s) may be fabricated from the same material as the leads of the semiconductor die.

9. A semiconductor die stack comprising:
    at least two semiconductor dies vertically stacked upon each other, each semiconductor die defines opposed top and bottom surfaces and opposed pairs of longitudinal and lateral side surfaces;
    leads which extend out from at least one of the side surfaces of each of the semiconductor dies, the leads define first end portions, middle portions, second end portions, first junctions and second junctions, the second junctions of the leads of the upper semiconductor die are electrically connected to respective ones of the first junctions of the leads of the lower semiconductor die, the first and second junctions of the leads of the upper and lower semiconductor dies are bent in opposing directions; and
    at least one wide jumper strip electrically connected to at least two leads of at least one of the semiconductor dies, the at least two leads which are electrically connected to the wide jumper strip have at least one interposed lead there between.

10. The semiconductor die stack of claim 9 wherein the wide jumper strip has a C shaped configuration.

11. The semiconductor die stack of claim 10 further comprising dielectric between the wide jumper strip and the interposed lead(s).

12. The semiconductor die stack of claim 11 wherein the wide jumper strip is electrically connected to the middle portions of the leads.

13. The semiconductor die stack of claim 12 wherein the wide jumper strip has a cross sectional area along its length equal to a cross sectional area along a height of the leads to which the wide jumper strip is attached.

14. The semiconductor die stack of claim 13 wherein the wide jumper strip may be fabricated from the same material as the leads of the semiconductor die.

* * * * *